United States Patent
Vaillant et al.

(10) Patent No.: US 11,076,081 B2
(45) Date of Patent: Jul. 27, 2021

(54) DEVICE FOR ACQUIRING A 2D IMAGE AND A DEPTH IMAGE OF A SCENE

(71) Applicant: Commissariat à l'Énergie Atomique et aux Énergies Alternatives, Paris (FR)

(72) Inventors: Jérôme Vaillant, Grenoble (FR); Yvon Cazaux, Grenoble (FR); Alexis Rochas, Coublevie (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 40 days.

(21) Appl. No.: 16/208,712

(22) Filed: Dec. 4, 2018

(65) Prior Publication Data

US 2019/0191067 A1 Jun. 20, 2019

(30) Foreign Application Priority Data

Dec. 19, 2017 (FR) ...................................... 1762469

(51) Int. Cl.
*H04N 5/225* (2006.01)
*H01L 27/146* (2006.01)
(Continued)

(52) U.S. Cl.
CPC ........... *H04N 5/2258* (2013.01); *H01L 25/18* (2013.01); *H01L 27/1462* (2013.01);
(Continued)

(58) Field of Classification Search
CPC ......... H01L 27/14625; H01L 27/14627; H01L 27/14634; H04N 5/2258; H04N 9/045
See application file for complete search history.

(56) References Cited

U.S. PATENT DOCUMENTS 9,419,031 B1 * 8/2016 Or-Bach ............. H01L 31/0725
9,818,791 B1   11/2017 Mao et al.
(Continued)

FOREIGN PATENT DOCUMENTS

FR          3 026 227 A1      3/2016

OTHER PUBLICATIONS

"Multiband Imaging CMOS Image Sensor with Multi-Storied Photodiode Structure"—Yoshiaki Takemoto, Mitsuhiro Tsukimura, Hideki Kato, Shunsuke Suzuki, Jun Aoki, Toru Kondo, Haruhisa Saito, Yuichi Gomi, Seisuke Matsuda and Yoshitaka Tadaki; Sensors (Basel). Jun. 2018; 18(6): 1688. (Year: 2018).*
(Continued)

*Primary Examiner* — Mainul Hasan
(74) *Attorney, Agent, or Firm* — Wolf, Greenfield & Sacks, P.C.

(57) ABSTRACT

A device of acquisition of a 2D image and of a depth image, including: a first sensor including a front surface and a rear surface, the first sensor being formed inside and on top of a first semiconductor substrate and including a plurality of 2D image pixels and a plurality of transmissive windows; and a second sensor including a front surface placed against the rear surface of the first sensor and a rear surface opposite to the first sensor, the second sensor being formed inside and
(Continued)

on top of a second semiconductor substrate and comprising a plurality of depth pixels arranged opposite the windows of the first sensor.

17 Claims, 3 Drawing Sheets

(51) Int. Cl.
H01L 31/107 (2006.01)
H01L 25/18 (2006.01)
H04N 9/04 (2006.01)
H04N 13/00 (2018.01)

(52) U.S. Cl.
CPC ...... *H01L 27/1465* (2013.01); *H01L 27/1469* (2013.01); *H01L 27/14623* (2013.01); *H01L 27/14625* (2013.01); *H01L 27/14627* (2013.01); *H01L 27/14634* (2013.01); *H01L 27/14636* (2013.01); *H01L 27/14645* (2013.01); *H01L 27/14649* (2013.01); *H01L 27/14685* (2013.01); *H01L 31/107* (2013.01); *H04N 9/045* (2013.01); *H04N 13/00* (2013.01); *H01L 27/1463* (2013.01); *H01L 27/14621* (2013.01)

(56) References Cited

U.S. PATENT DOCUMENTS

| | | | |
|---|---|---|---|
| 2010/0157117 A1* | 6/2010 | Wang | H01L 27/14652 348/276 |
| 2013/0234029 A1* | 9/2013 | Bikumandla | H01L 27/1464 250/349 |
| 2014/0015932 A1 | 1/2014 | Kim et al. | |
| 2014/0138520 A1* | 5/2014 | Liu | H01L 31/18 250/208.1 |
| 2014/0191357 A1* | 7/2014 | Lee | H04N 13/239 257/443 |
| 2014/0267851 A1* | 9/2014 | Rhoads | H01L 27/14625 348/294 |
| 2015/0054962 A1 | 2/2015 | Borthakur et al. | |
| 2016/0181226 A1 | 6/2016 | Wan | |
| 2017/0278826 A1 | 9/2017 | Sugizaki et al. | |
| 2018/0084238 A1* | 3/2018 | Chossat | H01L 27/1469 |

OTHER PUBLICATIONS

European Search Report for European Application No. 18208212, dated May 3, 2019.
Preliminary Search Report for French Application No. 1762469, dated Jul. 17, 2018.
Office Action for European Application No. 18208212.3, dated Feb. 1, 2021.

* cited by examiner

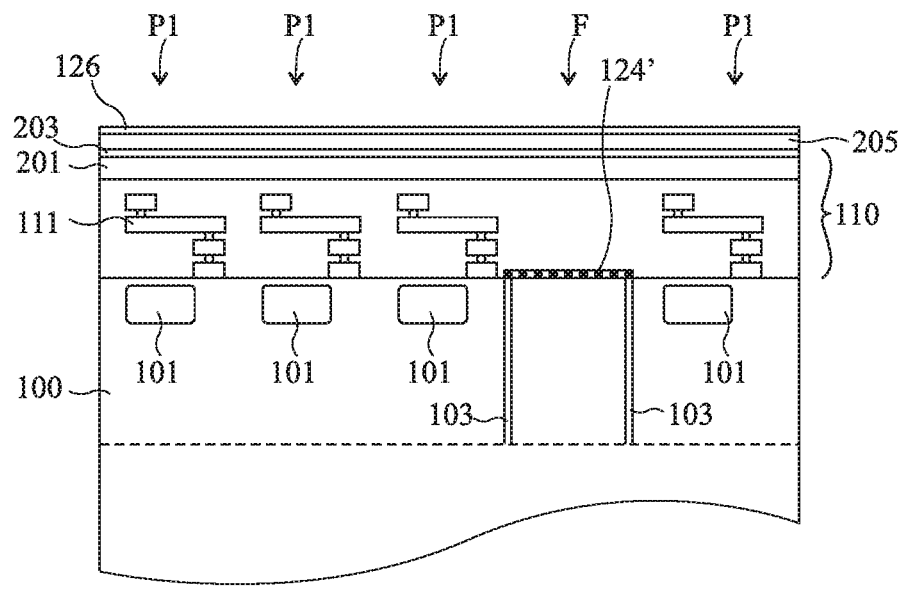
Fig 2bis
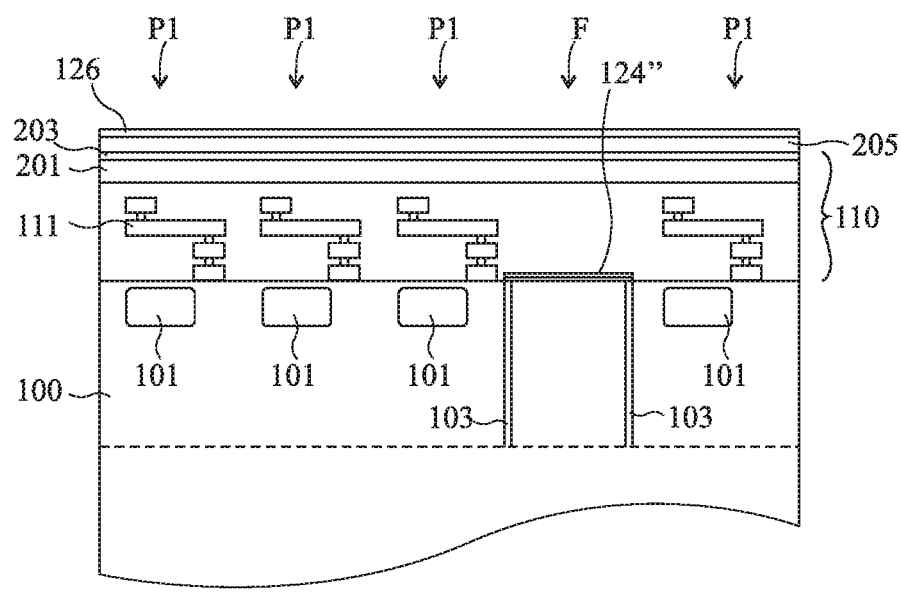
Fig 2ter

DEVICE FOR ACQUIRING A 2D IMAGE AND A DEPTH IMAGE OF A SCENE

This application claims the priority benefit of French patent application number 17/62469, the content of which is hereby incorporated by reference in its entirety to the maximum extent allowable by law.

BACKGROUND

The present application concerns image acquisition devices and, more particularly, image acquisition devices capable of acquiring a 2D image and a depth image of a scene.

DISCUSSION OF THE RELATED ART

Image acquisition devices capable of acquiring depth information have been provided. For example, time-of-flight (ToF) detectors act to emit a light signal towards a scene, and then to detect the return light signal reflected by objects of the scene. By the time-of-flight calculation of the light signal, the distance to the acquisition device of objects in the scene can be estimated. As an example, the pixels of such a sensor may use SPAD-type photodiodes (single photon avalanche diodes).

In certain applications, it would be desirable to be able to capture both a 2D image of a scene and a corresponding depth image of the scene.

While a solution to achieve this object would be to use separate image sensors to capture the 2D image and the depth image, such a solution is not optimal due to the fact that the sensors will have different viewpoints on the scene, which results in a misalignment between the pixels of the corresponding images. Further, the use of two sensors would increase the bulk and the cost of the device.

Another solution would be to integrate the pixels of the 2D image and the depth pixels in a same array of detectors. However, a problem is that depth pixels generally have significantly larger dimensions than 2D image pixels and/or significantly higher power supply voltages than 2D image pixels, which makes such an integration complex.

It would be desirable to have a device of acquisition of a 2D image and of a depth image of a scene, such a device at least partially overcoming one or a plurality of the disadvantages of known devices.

SUMMARY

Thus, an embodiment provides a device of acquisition of a 2D image and of a depth image, comprising:

a first sensor comprising a front surface and a rear surface, the first sensor being formed inside and on top of a first semiconductor substrate and comprising a plurality of 2D image pixels and a plurality of transmissive windows; and a second sensor comprising a front surface placed against the rear surface of the first sensor and a rear surface opposite to the first sensor, the second sensor being formed inside and on top of a second semiconductor substrate and comprising a plurality of depth pixels arranged opposite the windows of the first sensor.

According to an embodiment, each depth pixel comprises a SPAD-type photodiode.

According to an embodiment, each depth pixel comprises a plurality of memory areas coupled to a same detection area, and enables to measure a phase shift between an amplitude-modulated light signal, emitted by a light source of the device, and a light signal received by the pixel photodetection area, after reflection on a scene, an image of which is desired to be acquired.

According to an embodiment, the second sensor comprises an interconnection stack having electric connection tracks and/or terminals connecting the depth pixels of the second sensor to a peripheral circuit of control and power supply of the second sensor formed therein, said interconnection stack being arranged on the rear surface side of the second semiconductor substrate.

According to an embodiment, the first sensor comprises an interconnection stack having electric connection tracks and/or terminals connecting the 2D image pixels of the first sensor to a peripheral circuit of control and power supply of the first sensor formed therein, said interconnection stack being arranged on the rear surface side of the first semiconductor substrate.

According to an embodiment, the interconnection stack of the first sensor comprises no metallizations in the transmissive windows of the first sensor.

According to an embodiment, each 2D image pixel of the first sensor comprises a photodiode.

According to an embodiment, the first semiconductor substrate comprises no local implanted regions in the transmissive windows of the first sensor.

According to an embodiment, in each depth pixel of the second sensor, a photodetection area of the pixel is surrounded with a vertical insulating wall extending across the entire thickness of the second substrate.

According to an embodiment, in top view, the surface area of each depth pixel surrounded with the vertical insulating wall is greater than the surface area of the corresponding transmissive window of the first sensor.

According to an embodiment, each transmissive window of the first sensor comprises an optical bandpass filter capable of transmitting light only in a bandwidth at half maximum smaller than 30 nm.

According to an embodiment, each transmissive window of the first sensor comprises a microlens arranged between the rear surface of the first semiconductor substrate and the second sensor.

According to an embodiment, the device further comprises a control and processing circuit formed inside and on top of a third semiconductor substrate, said control and processing circuit being placed against the rear surface of the second sensor.

According to an embodiment, the control and processing circuit is attached to the rear surface of the second sensor by hybrid molecular bonding.

According to an embodiment, the first and second semiconductor substrates are made of single crystal silicon.

According to an embodiment, the first and second sensors are attached by molecular bonding.

According to an embodiment, the depth pixels are coupled by blocks of a plurality of neighboring pixels to form a photomultiplier.

According to an embodiment, each transmissive window of the first sensor comprises an active pixel, for example, an infrared pixel or a visible pixel.

The foregoing and other features and advantages will be discussed in detail in the following non-limiting description of specific embodiments in connection with the accompanying drawings.

BRIEF DESCRIPTION OF THE DRAWINGS

FIG. 2bis is a cross-section view illustrating in further detail an alternative embodiment of a 2D image sensor of the device of FIG. 1;

FIG. 2ter is a cross-section view illustrating in further detail another alternative embodiment of a 2D image sensor of the device of FIG. 1;

DETAILED DESCRIPTION

Figure 1:
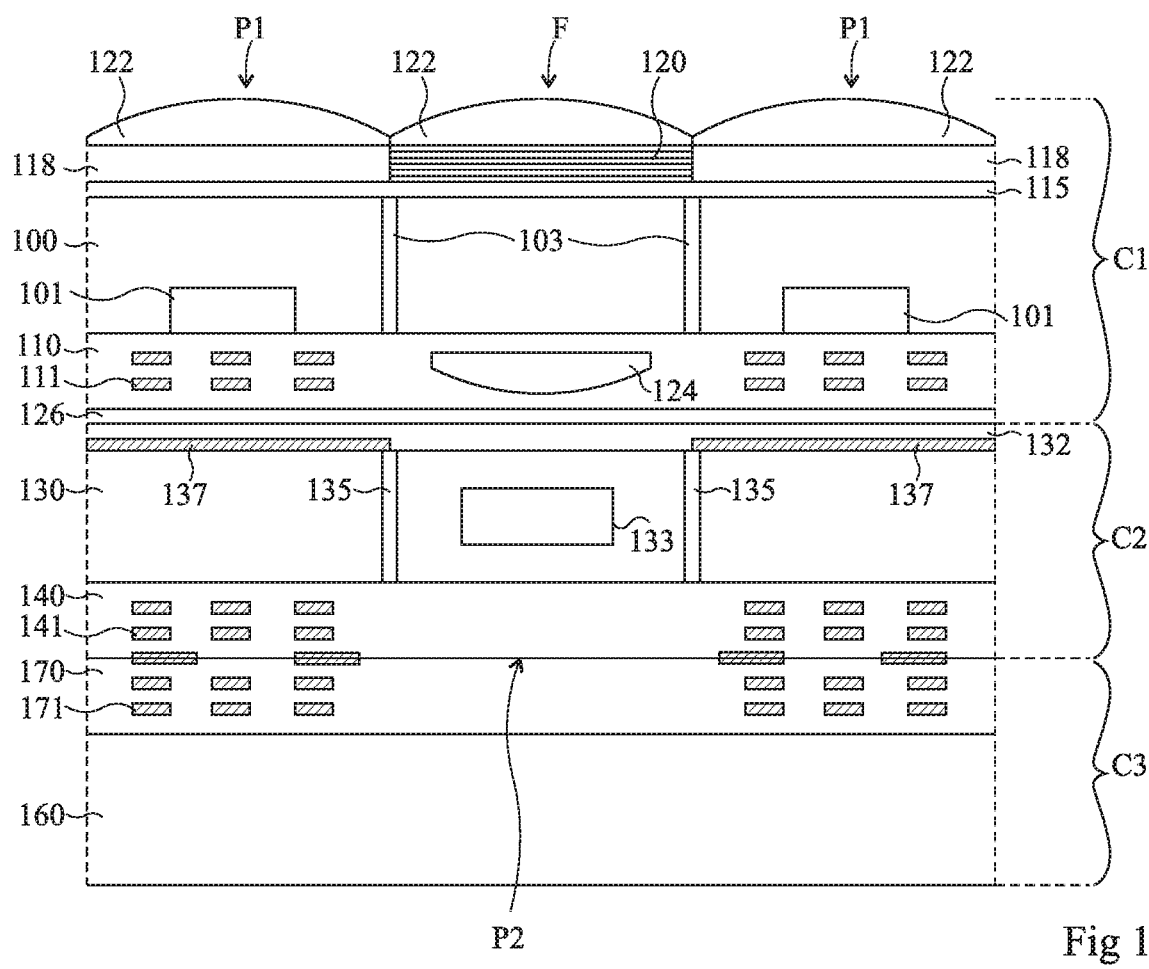
FIG. 1 is a cross-section view schematically and partially illustrating an embodiment of a device of acquisition of a 2D image and of a depth image.

The same elements have been designated with the same reference numerals in the various drawings and, further, the various drawings are not to scale. For clarity, only those steps and elements which are useful to the understanding of the described embodiments have been shown and are detailed. In particular, the forming of the photodiodes and of the control circuits of the 2D image pixels and of the depth pixels has not been detailed, the forming of such pixels being within the abilities of those skilled in the art based on the indications of the present description. In the following description, when reference is made to terms qualifying absolute positions, such as "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1 is a cross-section view schematically and partially illustrating an embodiment of a device of acquisition of a 2D image and of a depth image of a scene.

The device of FIG. 1 comprises:

a first sensor C1 formed inside and on top of a first semiconductor substrate 100, for example, a single crystal silicon substrate, sensor C comprising a plurality of 2D image pixels P1 and a plurality of windows F distributed across the sensor surface; and a second sensor C2 formed inside and on top of a second semiconductor substrate 130, for example, a single crystal silicon substrate, sensor C2 being placed against the rear surface of sensor C1 and comprising a plurality of a pixel of depth P2 respectively arranged opposite windows F of sensor C1, each pixel of depth P2 comprising a SPAD-type photodiode.

It should be noted that in the present description, front surface and rear surface of an element mans the surface of the element intended to face the scene, an image of which is desired to be acquired, and the surface of the element opposite to its front surface. In the example of FIG. 1, the front and rear surfaces of the acquisition device are respectively its upper surface and its lower surface.

In practice, the device of FIG. 1 is intended to be used in combination with a light source, for example, a laser source, emitting light at a determined wavelength or in a determined wavelength range, preferably a narrow wavelength range, for example, a range having a full width at half maximum smaller than 3 nm, for example, a source having a central emission wavelength in the order of 940 nm, for example, a source of the type mentioned in web page https://www.sony-semicon.co.jp/products_en/laserdiodewld/products/940tof_vcsel.html of Sony Company. As an example, the emission wavelength range of the light source is located out of the visible range, for example, in near infrared, for example, in the range from 700 to 1,000 µm. In operation, the light signal generated by the light source is transmitted towards the scene (for example, via one or a plurality of lenses), in the form of light pulses, for example, periodic pulses. The return light signal reflected by the scene is captured by depth pixels P2 of sensor C2, to measure the time of flight of the light signal at different points of the scene and deduce therefrom the distance to the acquisition device at different points of the scene. Pixels P1 of sensor C1 are capable of capturing visible light emitted by the scene to form a 2D image of the scene. Windows F of sensor C1 are transmissive in the emission range of the light source to allow the detection of the return light signal by depth pixels P2 of sensor C2. As an example, the transmission coefficient of windows F of sensor C1 in the emission wavelength range of the light source is greater than 50%.

In the shown example, each pixel P1 of sensor C1 comprises a photodiode 101 comprising one or a plurality of local implanted regions formed in semiconductor substrate 100. In this example, the implanted regions of photodiode 101 are arranged on the rear surface side of substrate 101. Each pixel P1 may further comprise one or a plurality of additional components (not shown), for example, control transistors, formed on the rear surface side of substrate 100, for example, in substrate 100 and on the rear surface side of substrate 100. Sensor C1 further comprises an interconnection stack 110, formed of alternated dielectric and conductive layers coating the rear surface of substrate 100, where electric connection tracks and/or terminals 111 connecting pixels P1 of the sensor to a peripheral control and power supply circuit, not shown, are formed.

In the shown example, sensor C1 comprises vertical insulating walls 103 crossing substrate 100 across its entire thickness and delimiting substrate portions respectively corresponding to the different windows F of sensor C1. Vertical insulating walls 103 particularly have an optical insulation function and may further have an electric insulation function. As an example, vertical insulating walls 103 are made of a dielectric material, for example, silicon oxide. Similar insulating walls may further be provided between pixels P1 of sensor C1.

In the shown example, substrate 100 of sensor C1 comprises no local implanted region in windows F of sensor C1, to maximize the transparency of the substrate in windows F. As a variation, in windows F, substrate 100 may be replaced with a material more transparent at the emission wavelength of the light source used for the distance measurement, for example, silicon oxide.

Further, in this example, interconnection stack 110 of sensor C1 comprises no metal element, but only dielectric layers in windows F, to maximize the transparency of the interconnection stack in windows F. The described embodiments are however not limited to this specific case. As a variation, interconnection stack 110 may comprise conductive elements extending over a portion of the surface of each window F.

The thickness of substrate 100 is for example in the range from 2 to 10 µm, for example, from 3 to 5 µm.

Each window F for example has, in top view, dimensions substantially identical to the dimensions of pixels P1 of sensor C1. As an example, in top view, the largest dimension of each pixel P1 or window F of sensor C1 is smaller than 10 µm, for example, smaller than 5 µm, for example, smaller than 2 µm, for example, in the order of 1 µm.

In the shown example, the front surface of substrate 100 is coated with a passivation layer 115, for example, a silicon oxide layer, a $HfO_2$ layer, a $Al_2O_3$ layer, or a stack of a plurality of layers of different materials capable of having other functions than the sole passivation function (antireflection, filtering, bonding, etc.), extending across substantially the entire surface of the sensor. As an example, layer 115 is arranged on top of and in contact with the front surface of substrate 100.

In the example of FIG. 1, sensor C1 is a 2D color image sensor, that is, it comprises pixels P1 of different types, capable of measuring light intensities in different visible wavelength ranges. For this purpose, each pixel P1 comprises a color filter 118, for example, a colored resin layer, arranged on the front surface of substrate 100, for example, on top of and in contact with the front surface side of passivation layer 115, opposite photodiode 101 of the pixel. As an example, sensor C1 comprises three types of pixels P1, first pixels P1 called blue pixels, comprising a color filter 118 mostly transmitting blue light, second pixels P1 called red pixels, comprising a color filter 118 mostly transmitting red light, and third pixels called green pixels, comprising a color filter 118 mostly transmitting green light. In FIG. 1, the different types of pixels are not differentiated. As a variation, sensor C1 may be a monochromatic 2D image sensor, in which case filters 118 may be omitted.

In the shown example, each window F of sensor C1 comprises a filter 120, for example, an interference filter, capable of transmitting light in the emission wavelength range of the light source. Preferably, filter 120 is capable of transmitting light only in a relatively narrow wavelength band centered on the emission wavelength range of the light source of the system, for example, a wavelength range having a full width at half maximum smaller than 30 nm, for example, smaller than 20 nm, for example, smaller than 10 nm. In this example, filter 120 is arranged on the front surface side of substrate 100, for example, inside of and in contact with the front surface of passivation layer 115, and extends across substantially the entire surface of window F. Filter 120 enables to avoid unwanted starting of the photodiode of underlying pixel P2 under the effect of a light radiation which does not originate from the light source of the system. In the example of FIG. 1, filter 120 is located at the level of windows F of the sensor only, and arranged on the upper surface of substrate 100, which enables to limit the crosstalk between pixels P1 of sensor C1. As a variation, filter 120 may be arranged between substrates 100 and 130, on the lower surface of substrate 100 or on the upper surface of substrate 130, and may extend continuously across substantially the entire surface of the device. In this case, to limit the crosstalk due to the light reflected (not transmitted and not absorbed) by filter 120, a metal shield formed in interconnection stack 110 may be provided at the periphery of each pixel P1 of sensor C1.

Each pixel P1 of sensor C1 may further comprise a microlens 122 arranged on the front surface side of substrate 100, for example on top of and in contact with color filter 118 of the pixel, capable of focusing the incident light on photodiode 101 of the pixel.

Further, each window F of sensor C1 may comprise an external microlens 122, for example similar or identical to microlenses 122 of pixels P1, arranged on the front surface side of substrate 100, for example, on top of and in contact with filter 120 of the window.

Each window F may further comprise an inner microlens 124 formed in interconnection stack 110 of the sensor and enabling, in cooperation with microlens 122 of the window, to focus the incident light on the photodiode of underlying pixel P2.

In the shown example, the rear surface of sensor C1 is bonded to the front surface of sensor C2 by molecular bonding. For this purpose, sensor C1 comprises a layer 126, for example, made of silicon oxide, coating its rear surface. Further, sensor C2 comprises a layer 132 of same nature as layer 126, for example, made of silicon oxide, coating its front surface. The rear surface of layer 126 is placed into contact with the front surface of layer 132 to perform a molecular bonding of sensor C2 to sensor C1. As an example, layer 126, respectively 132, continuously extends across the entire surface of sensor C1, respectively C2.

Each pixel P2 of sensor C2 comprises a SPAD-type photodiode 133 formed in substrate 130, opposite the corresponding window F of sensor C1. Photodiode 133 comprises one or a plurality of semiconductor regions formed in semiconductor substrate 130. Each pixel P2 may further comprise one or a plurality of additional components (not shown), for example, control transistors, formed on the rear surface side of substrate 130, for example, in substrate 130 and on the rear surface of substrate 130. Sensor C2 further comprises an interconnection stack 140, formed of alternated dielectric and conductive layers coating the rear surface of substrate 130, having electric connection tracks and/or terminals 141 connecting pixels P2 of the sensor to a peripheral control and power supply circuit, not shown, formed therein.

A SPAD photodiode is essentially formed by a reverse PN junction, reverse-biased at a voltage greater than its avalanche threshold. When no electric charge is present in the depletion area or space charge area of the PN junction, the photodiode is in a pseudo-stable non-conductive state. When a photogenerated electric charge is injected into the depletion area, if the displacement speed of this charge in the depletion area is sufficiently high, that is, if the electric field in the depletion area is sufficiently intense, the photodiode is likely to start an avalanche. A single photon is thus capable of generating a measurable electric signal, and this, with a very short response time, which is particularly adapted to the time-of-flight measurements which are desired to be performed. Most known SPAD photodiode structures may be used in sensor C2 of FIG. 1, for example structures with a planar surface PN junction, structures with a planar buried PN junction, or also structures with a planar vertical PN junction, for example, such as described in French patent application No. 16/58513 filed on Sep. 13, 2016 and in the corresponding PCT application No. PCT/FR2017/052406 filed on Sep. 11, 2017 (B15154/DD17140). The provision of SPAD photodiodes with vertical PN junctions, for example, such as described in the above-mentioned French and PCT applications, advantageously enables to limit the active surface area of detection of pixels P2. This enables for the dimensions, in top view, of pixels P2, and accordingly of windows F, to be relatively small, for example, of the same order as the dimensions of pixels P1, and thus to limit the resolution loss in the 2D image resulting from the presence of windows F.

In the shown example, in each pixel P2 of sensor C2, photodiode 133 of the pixel is totally surrounded with a vertical insulating wall 135 crossing substrate 130 across its entire thickness. Wall 135 particularly has an optical insulation function and may further have an electric insulation function. As an example, vertical insulating wall 135 is made of a dielectric material, for example, silicon oxide. As a variation, vertical insulating wall 135 is a multilayer wall comprising an inner layer made of a dielectric material, for example, silicon oxide, one or a plurality of intermediate layers comprising at least one metal layer, and an outer layer made of a dielectric material, for example, silicon oxide. Vertical insulating wall 135 is for example located substantially vertically in line with vertical insulating wall 103 surrounding substrate portion 100 of the corresponding window F of sensor C1. Walls 103 and 135 particularly enable to limit the risk for light rays received by a pixel P1 close to window F to activate the SPAD photodiode of the corresponding pixel P2, which might result in an erroneous depth measurement. In an alternative embodiment, the detection area of pixel P2 (and thus peripheral wall 135 of the pixel) has, in top view, a surface area greater than the surface area of the corresponding window F of sensor C1. This enables to ease the alignment of window F above pixel P2 on assembly of sensors C1 and C2.

It should be noted that a SPAD-type photodiode is generally associated with secondary circuits, particularly a circuit for biasing its PN junction to a voltage greater than its avalanche threshold, a readout circuit capable of detecting that an avalanche of the photodiode has been started, as well as a quenching circuit having the function of interrupting the avalanche of the photodiode once it has been started. Such secondary circuits have not been shown in the drawings and will not be detailed, the described embodiments being compatible with the secondary circuits equipping known SPAD photodiodes. The secondary circuits may for example be at least partly arranged inside and on top of the rear surface of the portions of substrate 130 located outside of vertical insulating walls 135 of the pixels.

In the example of FIG. 1, sensor C2 further comprises a metal shield 137 coating substantially the entire front surface of substrate 130, except for the portions of substrate 130 located inside of walls 135 (corresponding to the photodetection areas of pixels P2). Here again, the function of metal shield 137 is an optical insulation function, aiming at avoiding for light rays received by a pixel P1 close to window F to activate the SPAD photodiode of the corresponding pixel P2. As a variation, shield 137 is not continuous but is formed of a plurality of separate rings respectively surrounding, in top view, the photodetection areas of the different pixels P2 of the sensor. An advantage is that this enables to limit parasitic light reflections by shield 137 towards pixels P1 of sensor C1.

In this example, silicon oxide layer 132 for bonding sensor C2 to sensor C1 is arranged on top of and in contact with the front surface of metal shield 137 outside of the photodetection areas of pixels P2, and on top of and in contact with the front surface of substrate 130 in the photodetection areas of pixels P2.

The thickness of substrate 130 is for example in the range from 5 to 50 μm, for example, from 8 to 20 μm.

It should be noted that the arrangement of sensors C1 and C2 of the device of FIG. 1 is advantageous in that interconnection stack 140 of sensor C2 is located on the side of substrate 130 of the sensor opposite to sensor C1. Indeed, a difficulty encountered when it is desired to co-integrate conventional photodiode pixels and SPAD photodiode pixels is that the power supply levels required by the two types of pixels are very different, which requires providing relatively bulky electric insulation elements between neighboring pixels of different types. In the example of FIG. 1, sensors C1 and C2 are naturally electrically insulated at the level of their respective pixel arrays, as well as at the level of their respective control/readout circuits. Due to the arrangement of interconnection stack 140 of sensor C2 on the side of substrate 130 opposite to sensor C1, risks of breakdown and/or of parasitic coupling due to the potential difference between the conductive power supply tracks of the pixels of sensor C1 and the conductive power supply tracks of the pixels of sensor C2 are avoided. As an example, in the device of FIG. 1, the power supply voltage of pixels P2 of sensor C2 is at least five times, or even ten times greater than the power supply voltage of pixels P1 of sensor C1.

Optionally, the device of FIG. 1 may further comprise an additional control and processing circuit C3 formed inside and on top of a third semiconductor substrate 160, for example, a single-crystal silicon substrate, circuit C3 being placed against the rear surface of sensor C2. Circuit C3 for example comprises, for each depth pixel P2 of the sensor, an event time stamping circuit, for example, a TDC-type circuit ("Time to Digital Converter"), enabling to measure the time of flight of the reflected light signal captured by the pixel. In this example, circuit C3 comprises components formed on the front surface side of substrate 160, inside and on top of the front surface of substrate 160. Circuit C3 further comprises an interconnection stack 170, formed of alternated dielectric and conductive layers coating the front surface of substrate 160, having electric connection tracks and/or terminals 171 connecting the components of circuit C3 to a peripheral control and power supply circuit, not shown, formed therein.

In this example, the front surface of interconnection stack 170 of circuit C3 comprises corresponding electric connection metal areas arranged on the rear surface of interconnection stack 140 of sensor C2. As an example, the rear surface of sensor C2 is bonded to the front surface of circuit C3 by hybrid metal to metal/oxide to oxide molecular bonding.

Circuit C3 may further be connected to sensor C1 by insulated conductive vias (not shown) crossing sensor C2, located in a peripheral region of the device (at the periphery of the pixel arrays of sensors C1 and C2).

Figure 2:
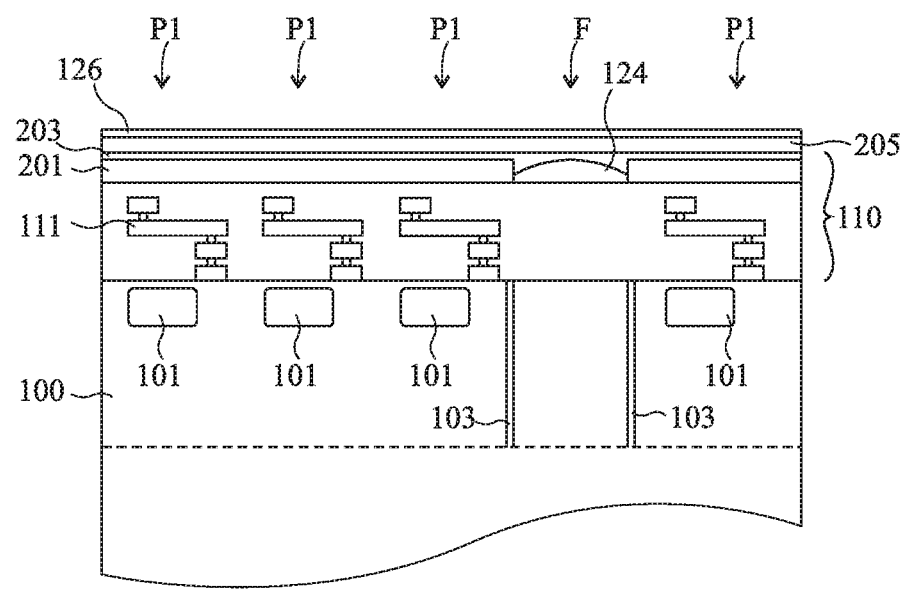
FIG. 2 is a cross-section view illustrating in further detail an embodiment of a 2D image sensor of the device of FIG. 1.

FIG. 2 is a cross-section view illustrating in further detail an embodiment of the 2D image sensor C1 of the device of FIG. 1.

To form the sensor, it is started from a relatively thick semiconductor substrate 100, for example, having a thickness of several hundreds of micrometers.

The implanted regions of photodiodes 101 and of the possible control components of pixels P1 of the sensor are formed from a first surface of the substrate, that is, its upper surface in the orientation of FIG. 2. Vertical insulating walls 103 delimiting, in top view, windows F of the sensor, are further formed from the upper surface of substrate 100.

Interconnection stack 110 of sensor C1 is then formed on the upper surface of substrate 100. In this example, the interconnection stack comprises a passivation layer 201, for example, made of silicon nitride. Microlens 124 of window F is formed in upper passivation layer 201. More particularly, to form microlens 124, a resin structure substantially having the shape of the lens which is desired to be formed is formed on the upper surface of layer 201, after which a local etching opposite the resin structure is implemented to transfer the pattern of the resin structure into layer 201. Interconnection stack 110 may further comprise an upper planarization layer 203 made of a material having a refraction index different from that of layer 201, for example, of silicon oxide.

In the example of FIG. 2, the upper surface of interconnection stack 110 is coated by a layer or a stack of layers 205, for example arranged on top of and in contact with the upper surface of planarization layer 203, forming an antireflection device for the emission wavelength of the light source used for distance measurement. Layer 205 may further be provided to filter the other wavelengths, then performing a function similar to that of filter 120 of FIG. 1. As a variation, the function of bandpass filtering at the wavelength of the light source is partly achieved by filter 120 and partly achieved by layer 205. This enables to release the constraints of filtering performance of filter 120, and thus to form a thinner filter 120.

Layer 126 intended to ensure the molecular bonding of sensor C1 to sensor C2 is arranged on top of and in contact with the upper surface of antireflection layer 205, it being understood that layer 126 can be taken into account in the sizing of antireflection layer 205.

It should be noted that in the example of FIG. 2, microlens 124 forms an optical element capable of favoring the transfer of the incident light from sensor C1 to pixels P2 of sensor C2. As a variation, microlens 124 may be replaced with other optical elements capable of carrying out this function.

FIG. 2bis illustrates an alternative embodiment of sensor C1, where microlens 124 is replaced with a nanostructured layer 124'. Layer 124' is for example formed of polysilicon pads (in black in the drawing) of nanometer-range dimensions, separated from one another by a filling material (in white in the drawings) having a lower optical index, for example, silicon oxide. As an example, the dimensions of the nanostructures of layer 124' are such that layer 124' fulfills the quarter wave antireflection conditions at wavelength $\lambda C2$ of use of sensor C2, that is, such that thickness e of the layer is in the order of $e=\lambda C2/(4*n\_eff)$, n_eff designating the effective index of layer 124'. As an example, the polysilicon pads have lateral dimensions in the range from 100 to 150 nm and are spaced apart two by two by approximately from 100 to 200 nm. Effective index n_eff of layer 124' is then in the order of 2.3 (in the case where the filling material is silicon oxide), and thickness e of layer 124' may be selected to be in the order of 100 nm to fulfill the quarter wave antireflection conditions for a wavelength $\lambda C2$ in the order of 940 nm. In the shown example, layer 124' is arranged in a lower portion of interconnection stack 110. As an example, layer 124' is formed in a polysilicon level having the gates of MOS transistors in CMOS technology formed therein.

FIG. 2ter illustrates another alternative embodiment of sensor C1, where microlens 124 is replaced with a multilayer stack 124" forming an antireflection device at wavelength $\lambda C2$ of use of sensor C2. In the shown example, stack 124" is arranged in a lower portion of interconnection stack 110. As an example, stack 124' may be a nitride-oxide-nitride stack where the thicknesses of the nitride layers and of the oxide layer are optimized to achieve the desired antireflection function. Although stack 124" has been shown locally in FIG. 2ter, in practice, stack 124" may extend across substantially the entire surface of sensor C1.

In another alternative embodiment, not shown, microlens 124 of FIG. 2 may be provided in combination with nanostructured layer 124' of FIG. 2bis or with multilayer stack 124" of FIG. 2ter.

Figure 3:
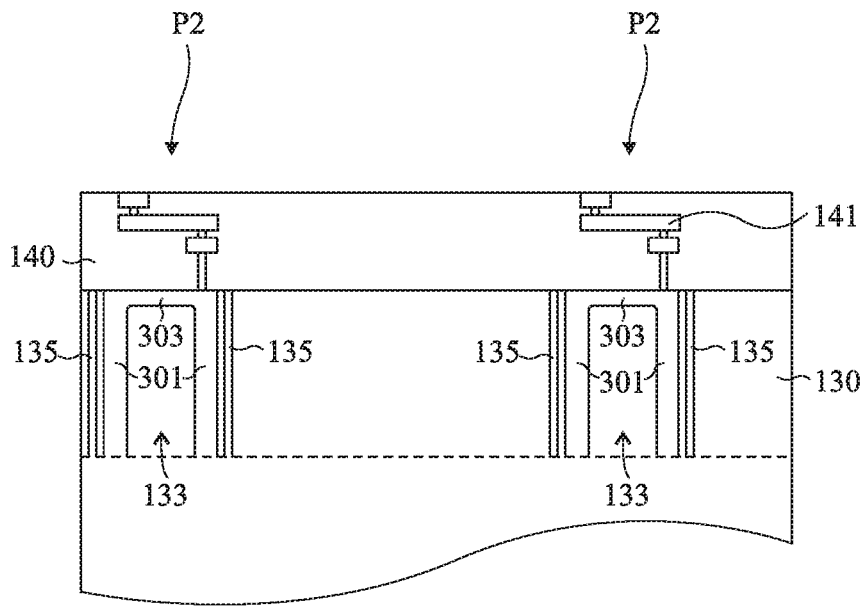
FIG. 3 is a cross-section view illustrating in further detail an embodiment of a depth image sensor of the device of FIG. 1.

FIG. 3 is a cross-section view illustrating in further detail an embodiment of depth image sensor C2 of the device of FIG. 1.

To form the sensor, it is started from a relatively thick semiconductor substrate 130, for example, having a thickness of several hundreds of micrometers.

SPAD-type photodiodes 133, as well as possible control components of pixels P2 of the sensor, are formed from a first surface of substrate 130, that is, its upper surface in the orientation of FIG. 3. Vertical insulating walls 135 delimiting, in top view, the areas of detection of pixels P2 of the sensor, are further formed from the upper surface of substrate 130.

In the shown example, each SPAD photodiode 133 comprises a first vertical semiconductor region 301 having a conductivity type opposite to that of substrate 130, extending in substrate 130 from its upper surface and towards its lower surface, the lateral surfaces of region 301 being in contact with substrate 130 and the junction between the lateral surfaces of region 301 and substrate 130 defining an avalanche area of the photodiode. As an example, region 301 has the shape of a tube with a substantially vertical central axis.

Each SPAD photodiode 133 may further comprise a second horizontal semiconductor region 303 of same conductivity type as region 301, arranged on the upper surface side of substrate 130, the upper surface of vertical region 301 being in contact with the lower surface of horizontal region 303. As an example, region 303 has the shape of a substantially horizontal cover closing the upper end of tubular region 301.

Horizontal semiconductor region 303 may have a doping level lower than that of vertical semiconductor region 301, or a doping level substantially equal to that of vertical semiconductor region 301.

The advantages of such a SPAD photodiode structure are described in above-mentioned French patent applications No. 16/58513 and PCT No. PCT/FR2017/052406.

After the forming of SPAD photodiodes 133 and of vertical insulating walls 135, interconnection stack 140 of sensor C2 is formed on the upper surface of substrate 130.

The forming of the device of FIG. 1 may comprise the steps of:

forming control and processing circuit C3;

partially forming sensor C2 according to the steps described in relation with FIG. 3;

flipping sensor C2 of FIG. 3 and performing a hybrid bonding (meta-metal/oxide-oxide) of the upper surface (in the orientation of FIG. 3) of sensor C2 to the upper surface (in the orientation of FIG. 1) of circuit C3;

thinning substrate 130 of sensor C2 by using circuit C3 as a handle;

possibly forming a bandpass filter capable of mostly giving way to the emission wavelength range of the light source used to perform the distance measurement;

possibly forming metal shield 137 on the upper surface (in the orientation of FIG. 1) of thinned substrate 130;

partially forming sensor C1 according to the steps described in relation with FIG. 2;

flipping sensor C1 of FIG. 2 and bonding the upper surface (in the orientation of FIG. 2) of sensor C1 to the upper surface (in the orientation of FIG. 1) of thinned substrate 130, with no electric contact between sensors C1 and C2;

thinning substrate 100 of sensor C1 by using circuit C3 and sensor C2 as a holding handle; and forming the upper elements of sensor C1 (passivation layer 115, filters 118 and 120 and microlenses 122 in particular) on the upper surface of thinned substrate 100.

Figure 4:
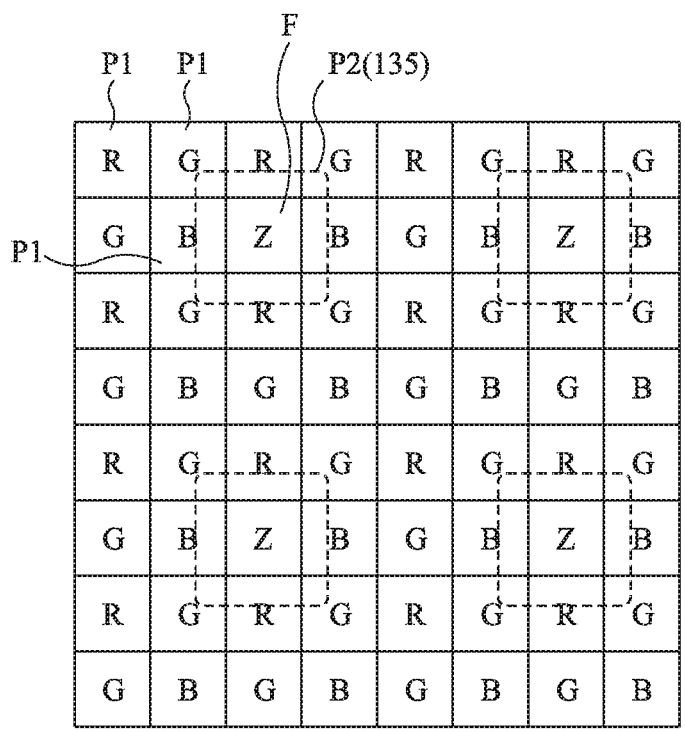
FIG. 4 is a simplified top view showing an example of arrangement of the 2D pixels and of the depth pixels in the device of FIG. 1.

FIG. 4 is a simplified top view of the device of FIG. 1 showing an example of layout of 2D pixels P1 and of depth pixels P2 in the device of FIG. 1.

In this example, sensor C1 is a color sensor comprises three different types of pixels P1, that is, red pixels (R), blue pixels (B), and green pixels (G). Pixels P1 are distributed in an array of rows and columns, for example, according to a Bayer pattern. Periodically, a pixel P1 of the array is replaced with a window F (one pixel out of 4 in the row direction and one pixel out of 4 in the column direction in the shown example) topping a pixel P2 of sensor C2. The vertical insulating wall 135 delimiting the detection area of each pixel P2 has been shown in dotted lines in FIG. 4. In this example, in top view, the dimensions of the detection areas of pixels P2 of sensor C2 are greater than the dimensions of windows F of sensor C1. This enables to ease the alignment of sensor C1 relative to sensor C2 on forming of the device.

In the device of FIG. 1, depth pixels P2 can be individually controlled to generate a depth image having a resolution equal to the number of pixels P2 of sensor C2.

As a variation, pixels P2 may be coupled by blocks of a plurality of neighboring pixels, for example, blocks of three by three neighboring pixels P2 to form a photomultipler, for example, of SIPM type. It is then provided to only retain the correlated events within each block. In other words, only the events simultaneously detected by a plurality of pixels of the block will be retained to construct the depth image. The resolution of the depth image is then smaller than the number of pixels P2 of sensor C2, but the immunity to noise of the depth image sensor is thereby improved.

It should be noted that according to the considered application, the rate of acquisition of the 2D images by sensor C1 may be different from the rate of acquisition of the depth images by sensor C2.

Specific embodiments have been described. Various alterations and modifications will occur to those skilled in the art. In particular, embodiments where the bonding between sensors C1 and C2 is a molecular bonding of an oxide layer 126 of sensor C1 to an oxide layer 132 of sensor C2 has been described. The embodiments are however not limited to this specific case. As a variation, layers 126 and 132 may be metal layers, the performed bonding then being a metal to metal molecular bonding. In this case, metal layers 126 and 132 may comprise openings opposite windows F of sensor C1. The stack of layers 126 and 132 then forms a metal shield substantially coating the entire front surface of substrate 130 of sensor C2 except for the detection areas of pixels P2, this shield being capable of replacing shield 137 of FIG. 1.

Further, embodiments where each depth pixel P2 of sensor C2 comprises a SPAD-type photodiode have been described. The described embodiments are however not limited to this specific case. As a variation, the depth pixel may be formed in any other technology adapted to the implementation of a measurement of the time of flight of a light signal emitted by a light source and reflected by the scene. As an example, the depth pixel may be a lock-in-type pixel, such as described in French patent applications No. 16/62341 (DD17552/B15537) and No. 16/62340 (DD17326/B15344) previously filed by the applicant, that is, a pixel comprising a plurality of memory areas coupled to a same detection area, and enabling to measure a phase shift between an amplitude-modulated light signal, emitted by the light source, and a light signal received by the photodetection area of the pixel, after reflection on the scene.

Further, embodiments where the transmissive windows F formed in sensor C1 comprise no active component have been described hereabove. The described embodiments are however not limited to this specific case. As a variation, it may be provided to arrange, in each window F of sensor C1, an active pixel, for example, an infrared pixel, or a visible pixel.

As an example, it may be provided to include in each window F an infrared pixel. The infrared pixels provided in transmissive windows F for example enable to perform performance measurements by means of a light source applying a structured lighting onto the scene. As an example, the depth measurement using the structured light and the infrared pixels of sensor C1 may be used to measure relatively short distances, for example, shorter than 5 meters, while the depth measurement by time-of-flight measurement, using pixels P2 of sensor C2, may be used to measure relatively long distances, for example, longer than 5 meters.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device of acquisition of a 2D image and of a depth image, comprising:
    a first sensor comprising a front surface and a rear surface, the first sensor being formed inside and on top of a first semiconductor substrate and comprising, in top view, an alternation of:
    a plurality of 2D image pixels each comprising a photodiode formed in the first semiconductor substrate, and
    a plurality of transmissive windows each comprising a portion of the first semiconductor substrate; and
    a second sensor comprising a front surface placed against the rear surface of the first sensor and a rear surface opposite to the first sensor, the second sensor being formed inside and on top of a second semiconductor substrate and comprising a plurality of depth pixels arranged opposite the transmissive windows of the first sensor, each depth pixel comprising a photodiode formed in the second semiconductor substrate and vertically aligned with a corresponding transmissive window of the first sensor, wherein each transmissive window of the first sensor comprises, between the rear surface of the first semiconductor substrate and the second sensor, and vertically aligned with the photodiode of the corresponding depth pixel, an optical element capable of favoring the transfer of the incident light from the corresponding transmissive window of the first sensor to the photodiode of the depth pixel of the second sensor, and
    wherein said optical element comprises a microlens, a nanostructured layer, or a multilayer stack with antireflection properties at a detection wavelength of the depth pixels of the second sensor.

2. The device of claim 1, wherein each transmissive window of the first sensor comprises an active pixel.

3. The device of claim 1, wherein the second sensor further comprises a metal shield substantially coating the entire front surface of the second semiconductor substrate, except for the portions of the second substrate located opposite the transmissive windows of the first sensor.

4. The device of claim 1, wherein each depth pixel comprises a SPAD-type photodiode.

5. The device of claim 1, wherein each depth pixel comprises a plurality of memory areas coupled to a same detection area, and enables to measure a phase shift between an amplitude-modulated light signal, emitted by a light source of the device, and a light signal received by the pixel photodetection area, after reflection on a scene an image of which is desired to be acquired.

6. The device of claim 1, wherein the second sensor comprises an interconnection stack having electric connection tracks and/or terminals connecting the depth pixels of the second sensor to a peripheral control and power supply circuit of the second sensor formed therein, said interconnection stack being arranged on the rear surface side of the second semiconductor substrate.

7. The device of claim 1, wherein the first sensor comprises an interconnection stack having electric connection tracks and/or terminals connecting the 2D image pixels of the first sensor to a peripheral control and power supply circuit of the first sensor formed therein, said interconnection stack being arranged on the rear surface side of the first semiconductor substrate.

8. The device of claim 7, wherein the interconnection stack of the first sensor comprises no metallizations in the transmissive windows of the first sensor.

9. The device of claim 1, wherein, in each depth pixel of the second sensor, a photodetection area of the pixel is surrounded with a vertical insulating wall extending across the entire thickness of the second substrate.

10. The device of claim 9, wherein, in top view, the surface area of each depth pixel surrounded with the vertical insulating wall is greater than the surface area of the corresponding transmissive window of the first sensor.

11. The device of claim 1, wherein each transmissive window of the first sensor comprises an optical bandpass filter capable of transmitting light only in a bandwidth at half maximum smaller than 30 nm.

12. The device of claim 1, further comprising a control and processing circuit formed inside and on top of a third semiconductor substrate, said control and processing circuit being placed against the rear surface of the second sensor.

13. The device of claim 1, wherein the control and processing circuit is attached to the rear surface of the second sensor by hybrid molecular bonding.

14. The device of claim 1, wherein the first and second semiconductor substrates are made of single-crystal silicon.

15. The device of claim 1, wherein the first and second sensors are attached by molecular bonding.

16. The device of claim 1, wherein the depth pixels are coupled by blocks of a plurality of neighboring pixels to form a photomultiplier.

17. The device of claim 11, wherein the optical bandpass filter is arranged between the first substrate and the second substrate and extends continuously across substantially the entire surface of the device.

* * * * *